US012300918B2

(12) United States Patent
Singh et al.

(10) Patent No.: US 12,300,918 B2
(45) Date of Patent: May 13, 2025

(54) MEMORY MODULE CONNECTOR FOR THIN COMPUTING SYSTEMS

(71) Applicant: Intel Corporation, Santa Clara, CA (US)

(72) Inventors: Navneet Kumar Singh, Bangalore (IN); Aiswarya M. Pious, Bengaluru (IN); Richard S. Perry, Portland, OR (US); Amarjeet Kumar, Bangalore (IN); Siva Prasad Jangili Ganga, Bengaluru (IN); Gaurav Hada, Bangalore (IN); Sushil Padmanabhan, Thrissur (IN); Konika Ganguly, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 640 days.

(21) Appl. No.: 17/479,596

(22) Filed: Sep. 20, 2021

(65) Prior Publication Data

US 2022/0077609 A1 Mar. 10, 2022

(51) Int. Cl.
*H01R 12/00* (2006.01)
*H01R 12/70* (2011.01)
*H01R 12/73* (2011.01)
*H01R 43/26* (2006.01)

(52) U.S. Cl.
CPC ..... *H01R 12/7082* (2013.01); *H01R 12/7047* (2013.01); *H01R 12/7076* (2013.01); *H01R 12/732* (2013.01); *H01R 43/26* (2013.01); *H01R 2201/06* (2013.01)

(58) Field of Classification Search
CPC ............ H01R 12/7082; H01R 12/7047; H01R 12/7076; H01R 12/32
See application file for complete search history.

(56) References Cited

U.S. PATENT DOCUMENTS

| | | | | |
|---|---|---|---|---|
| 4,400,049 A | * | 8/1983 | Schuck | H01R 12/721 439/631 |
| 4,660,920 A | * | 4/1987 | Shibano | H01R 12/721 439/724 |
| 4,708,415 A | * | 11/1987 | White | H01R 12/725 439/59 |
| 4,717,218 A | * | 1/1988 | Ratcliff | H01R 12/721 439/328 |
| 4,826,447 A | * | 5/1989 | Forker | H01R 12/7005 439/328 |

(Continued)

*Primary Examiner* — Neil Abrams
(74) *Attorney, Agent, or Firm* — Compass IP Law PC

(57) ABSTRACT

A connector to connect an electronic module to an edge of a first electronic circuit board is described. The module has a second electronic circuit board. The connector has a top part that houses a first row of I/Os. The top part is to be placed on a surface of the first electronic circuit board. The connector has a bottom part that houses a second row of I/Os. The bottom part is to be placed on an opposite surface of the first electronic circuit board, wherein, the top and bottom parts form inner and outer stand-offs when mater together. The inner stand-off is to reside within a through hole of the first electronic circuit board. The outer stand-off is to reside within free space off the edge of the first electronic circuit board. The second electronic circuit board is to be pressed in between the first row of I/Os and the second row of I/Os when the module is connected to the connector.

20 Claims, 8 Drawing Sheets

(56) References Cited

U.S. PATENT DOCUMENTS

| | | | | |
|---|---|---|---|---|
| 5,655,922 A * | 8/1997 | Dux | ............... | H05K 7/1478 |
| | | | | 439/717 |
| 6,406,332 B1 * | 6/2002 | Buican | ............... | H01R 12/721 |
| | | | | 439/631 |
| 7,731,518 B2 * | 6/2010 | Miyazoe | ............... | H01R 12/721 |
| | | | | 439/631 |
| 7,845,985 B2 * | 12/2010 | Brunker | ............... | H01R 12/732 |
| | | | | 439/631 |
| 8,162,678 B2 * | 4/2012 | Wang | ............... | H01R 12/724 |
| | | | | 439/78 |
| 8,690,589 B2 * | 4/2014 | Ngo | ............... | H01R 12/721 |
| | | | | 439/79 |
| 11,445,610 B2 * | 9/2022 | Seo | ............... | H05K 1/142 |

* cited by examiner

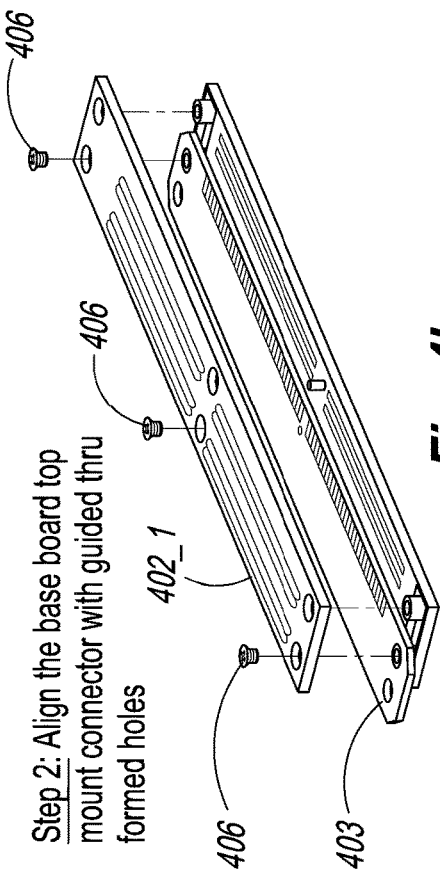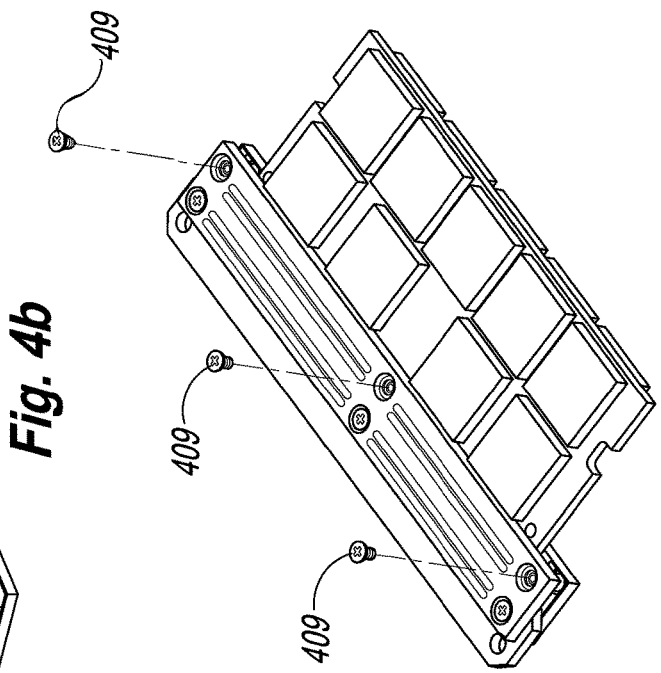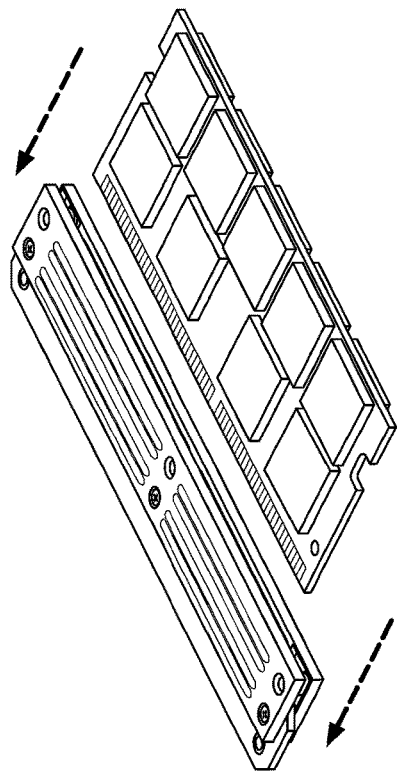

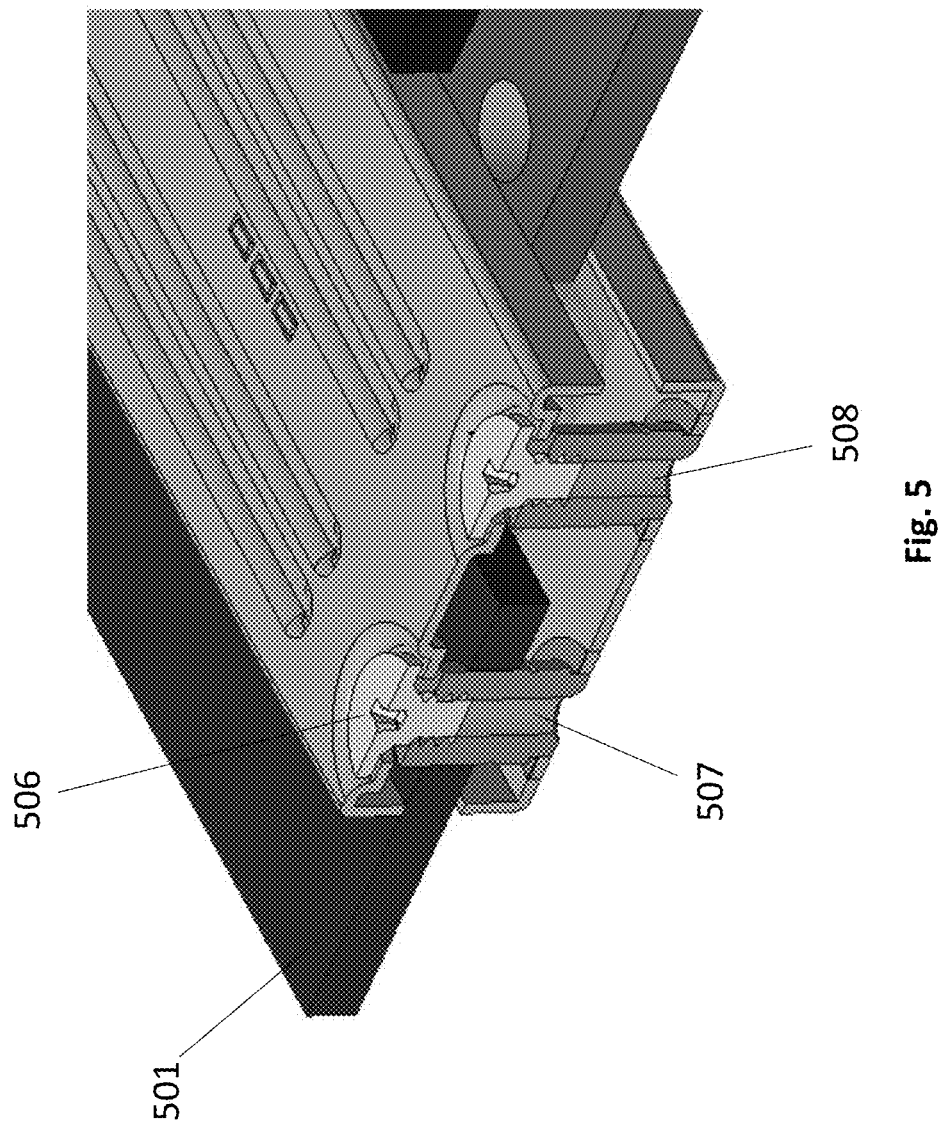

MEMORY MODULE CONNECTOR FOR THIN COMPUTING SYSTEMS

FIELD OF INVENTION

The field of invention pertains to the mechanical arts, generally, and, more specifically, to a memory module connector for thin computing systems.

BACKGROUND

System design engineers face challenges as both computers and networks continue to pack higher and higher levels of performance into smaller and smaller packages. Creative packaging solutions are therefore being developed to keep pace with the demands of such aggressively designed systems.

FIGURES

Figure 1:
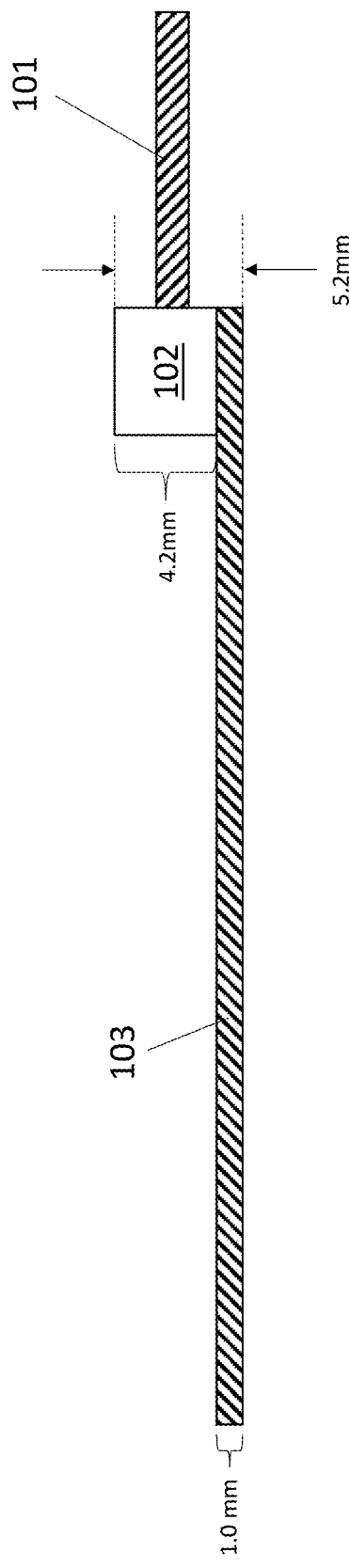
Figure 2:
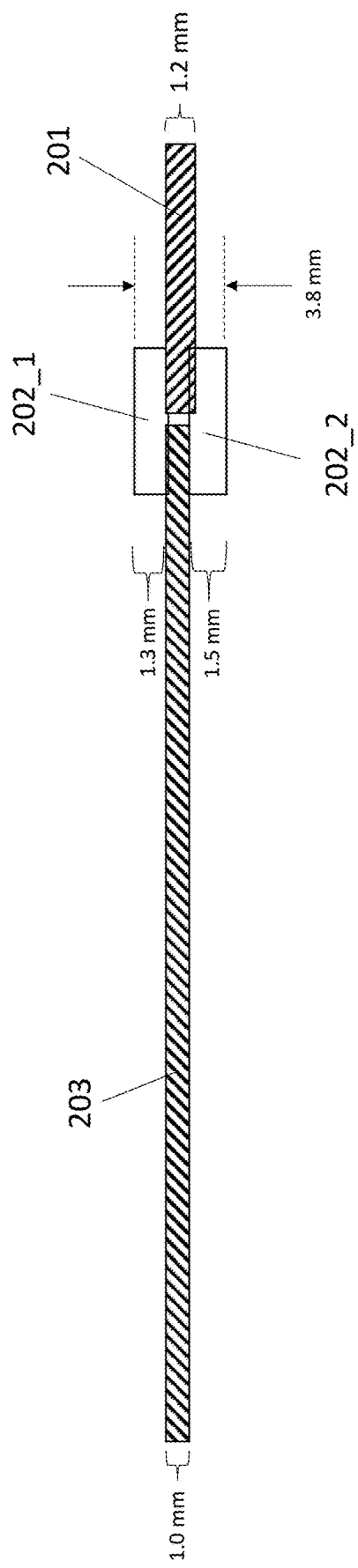
Figure 3:
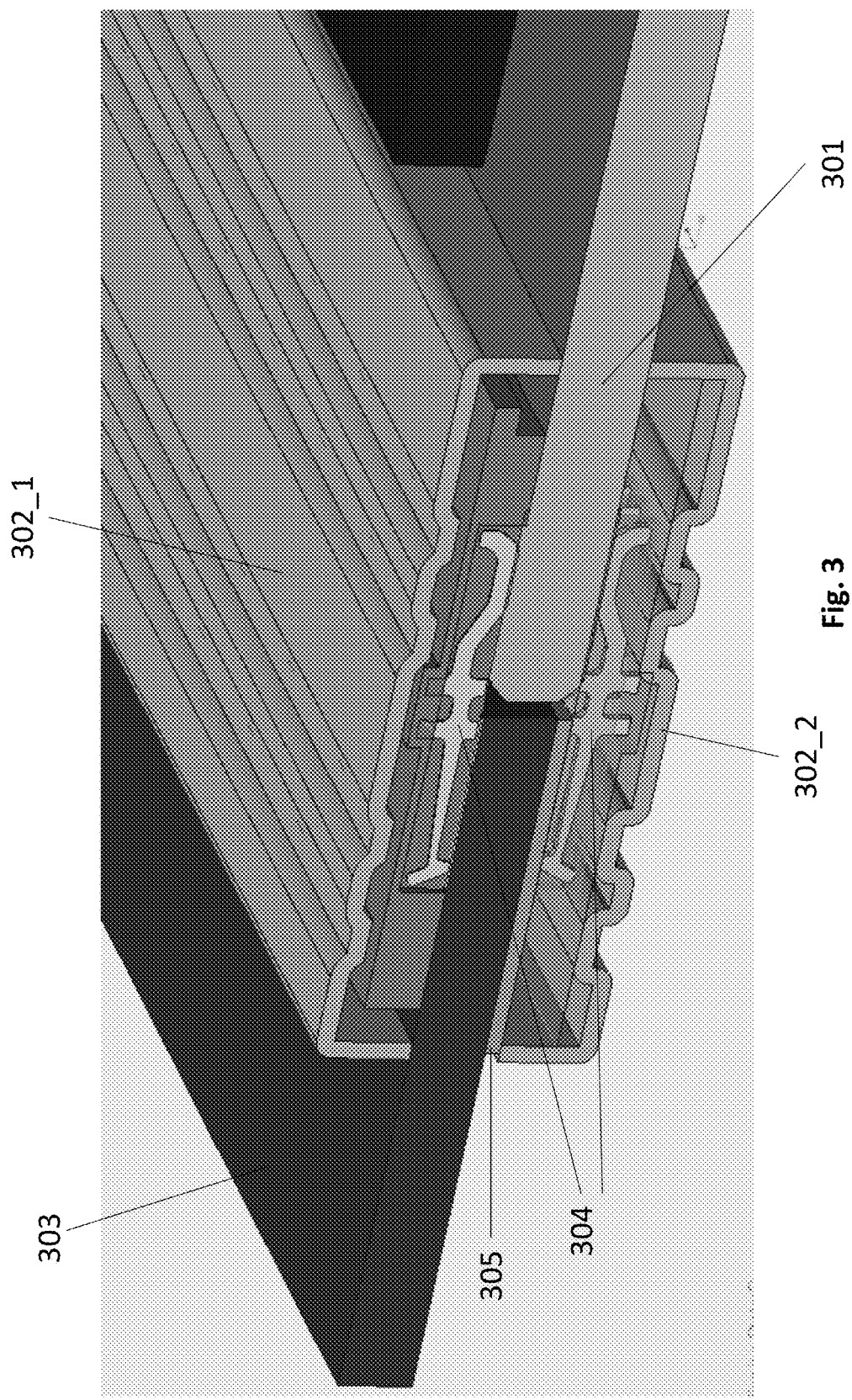
Figure 6:
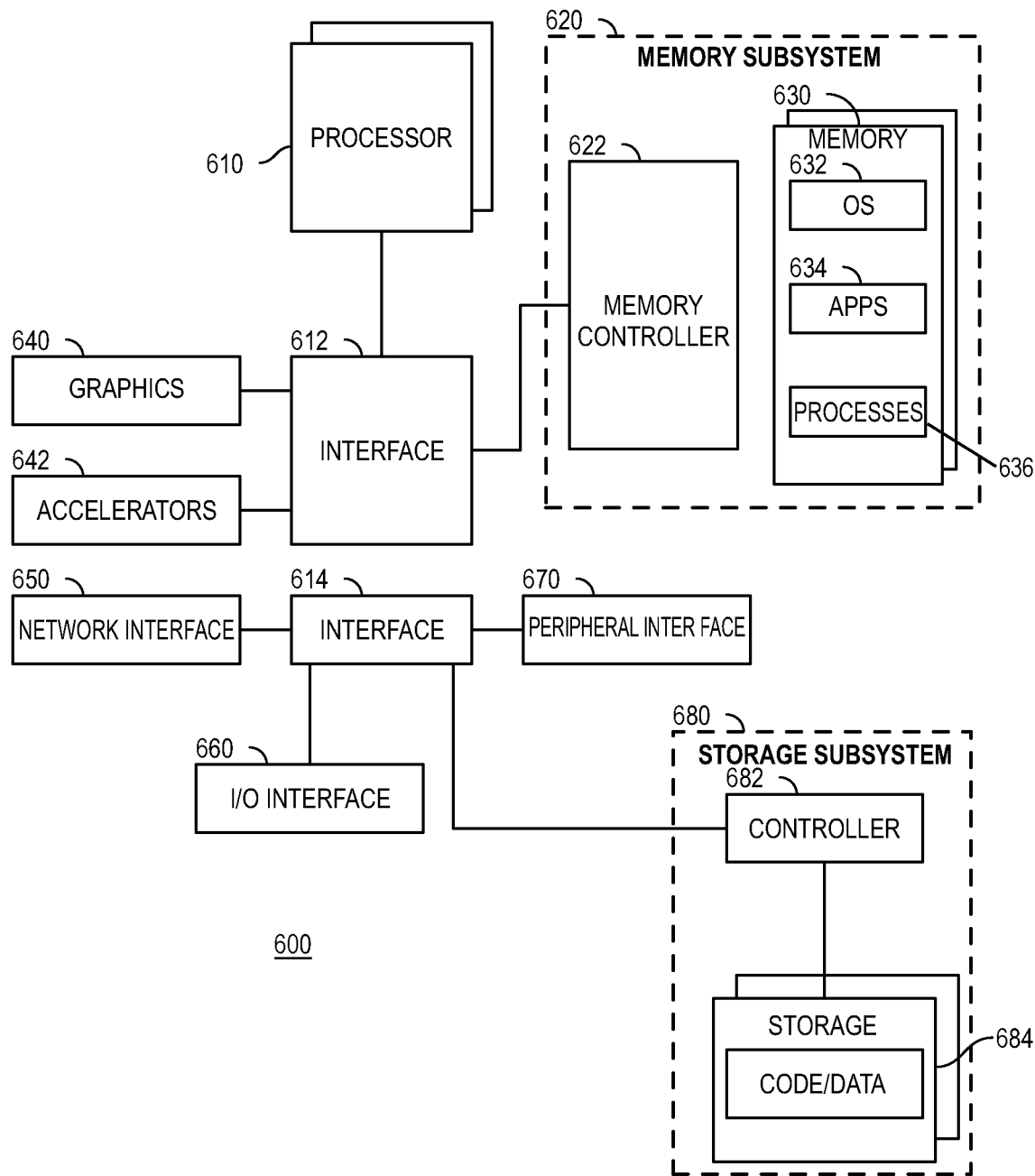
Figure 7:
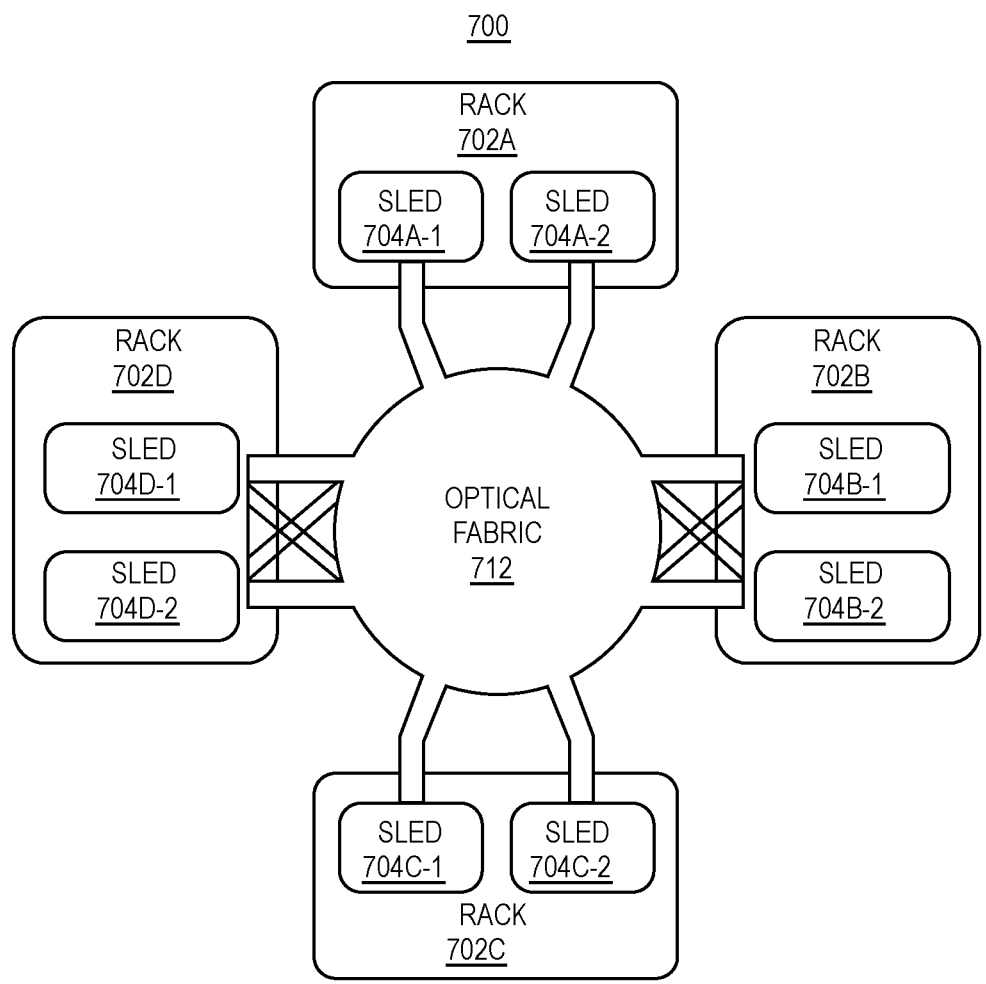
Figure 8:
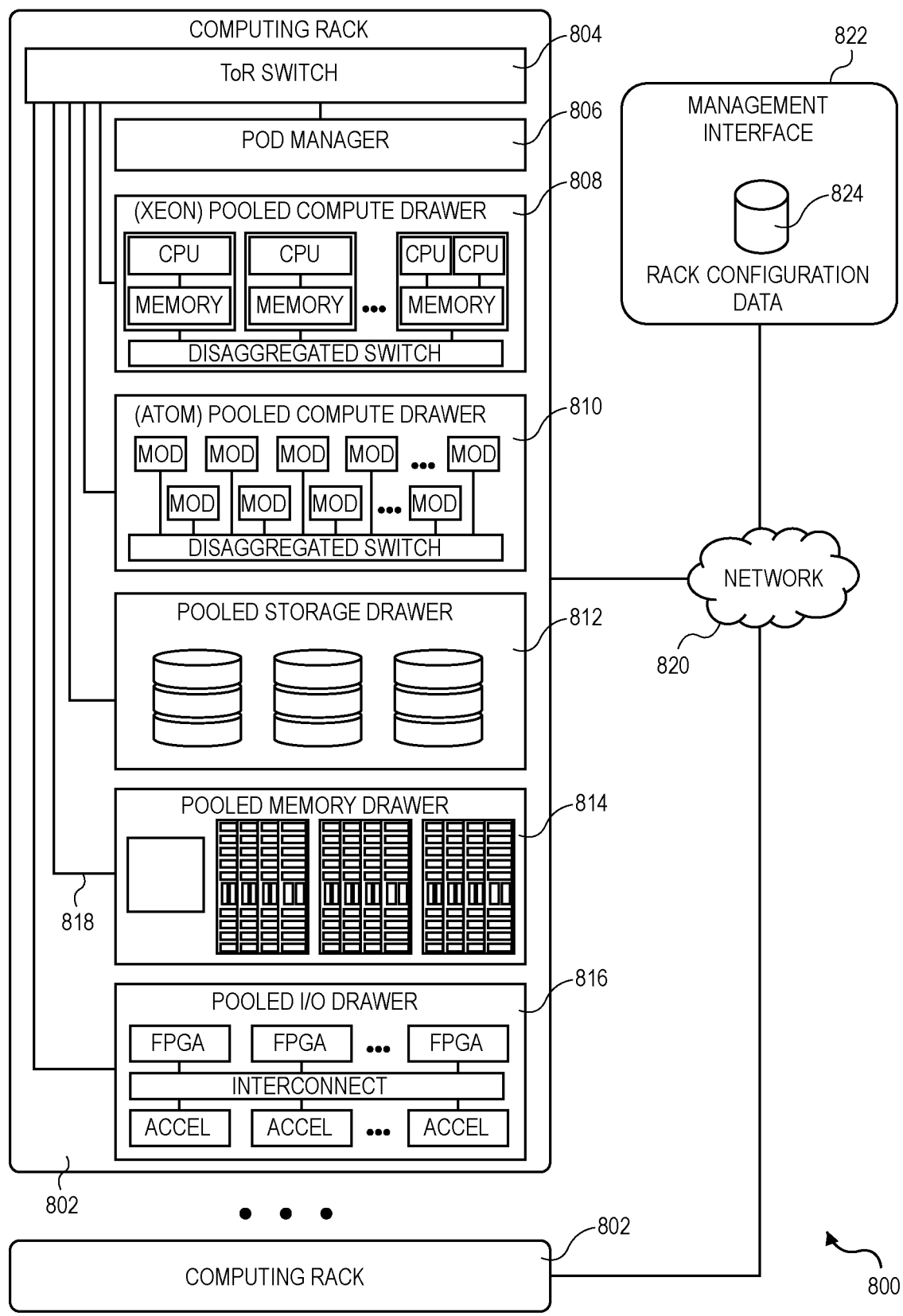

A better understanding of the present invention can be obtained from the following detailed description in conjunction with the following drawings, in which:

FIG. 1 shows a prior art SODIMM connector (prior art);
FIG. 2 shows an improved SODIMM connector;
FIG. 3 shows an edge of the improved SODIMM connector;
FIGS. 4a, 4b, 4c and 4d show a process for connecting an SODIMM to a motherboard with the improved SODIMM connector;
FIG. 5 shows pillars of the improved SODIMM connector;
FIG. 6 shows a system;
FIG. 7 shows a data center;
FIG. 8 shows a rack.

DETAILED DESCRIPTION

Thin form factor computer systems (e.g., thin notebook or laptop computers, etc.) are typically designed to include small outline dual in-line memory modules (SODIMMs). From a packaging perspective, SODIMMs are designed more aggressively than standard DIMMs (SODIMMs are approximately half the size of standard DIMMs). Even so, mechanical integration of SODIMMs has shortcomings at least for leading edge thin form factor systems.

Specifically, referring to FIG. 1, which depicts a side view of a current state of the art SODIMM packaging solution, note that the total solution has a thickness of 5.2 mm. Here, the SODIMM 101 plugs into a connector 102 that is mounted on the system's main electronic circuit board 103 ("motherboard"). As observed in FIG. 1, the maximum thickness of the solution occurs at the SODIMM connector 102. The connector 102 itself has a thickness of 4.2 mm and the motherboard 103 has a thickness of 1 mm. Thus, the total thickness of a motherboard 103 with SODIMM 101 has a maximum along the vertical axis where the SODIMM connector 102 is mounted to the motherboard 103.

For future thin notebook and laptop computers, 5.2 mm is too large a vertical dimension for the motherboard 103 and SODIMM connector 102. As such, system designers are faced with the difficult decision of not using SODIMMs, and instead soldering system memory chips directly to the motherboard 103 which limits/negates system configuration options.

An embodiment of an improved packaging design is observed in FIG. 2. As observed in FIG. 2, the connector is "split" into a top part 202_1 and a bottom part 202_2 so that the vertical position of the SODIMM 201 is aligned with the motherboard 203 (the motherboard typically includes a computer system's central processing unit (CPU) or a networking system's switching core). In the embodiment of FIG. 2, the top portion 202_1 has a thickness of 1.3 mm while the bottom part 202_2 has a thickness of 1.5 mm. With a 1 mm motherboard 203 between the top 202_1 and bottom 202_2 connector parts, the thickness of the overall solution is reduced to 3.8 mm. A maximum thickness of 3.8 mm for a motherboard 203 with SODIMM 201 is acceptable for the thinnest notebook/laptop computer systems.

FIG. 3 shows a more detailed view of the improved design. As observed in FIG. 3, both the top and bottom parts 302_1, 302_2 are composed of respective housings for rows of edge connector pins 304 (FIG. 3 only shows the leftmost pin for both the top part's row of pins and the bottom part's row of pins). The SODIMM's electronic circuit board 301 has I/O traces on both the upper and lower faces of the edge that is inserted into the connector. Each I/O trace makes contact with a corresponding connector pin to form the electro-mechanical connection between the motherboard 303 and the SODIMM 301 (each pin/trace connection corresponds to an electrical signal or voltage that is passed between the motherboard 303 and the SODIMM 301).

In the embodiment of FIG. 3, the pins are akin to leaf springs and the respective housings of the top and bottom parts 302_1, 302_2 are designed to position the springs 304 such that they will be compressed when the SODIMM's electronic circuit board 301 is inserted into the connector 302. The springs 304 respond to the compression with a recoil that applies a mechanical force to the circuit board edge 301 of the SODIMM that keeps the SODIMM rigidly secure in the connector 302 and ensures good signal integrity (the SODIMM's traces are tightly pressed against their corresponding connector pins).

In the embodiment of FIG. 3, the SODIMM's electronic circuit board 301 is thicker than the motherboard 303. An interposer 305 is therefore placed between the bottom face of the motherboard 303 and the top face of the bottom part 302_2 of the connector. Ideally, the combined thickness of the interposer 305 and motherboard 303 is equal to the thickness of the SODIMM's electronic circuit board 301. In an alternative embodiment the interposer 305 is placed between the top face of the motherboard 303 and the top part 302_1 of the connector.

Conceivably, the reverse approach can be applied for implementations where the motherboard 303 is thicker than the SODIMM's electronic circuit board 301, in which case the interposer is placed between the SODIMM's electronic circuit board and one of the connector's top and bottom parts.

FIGS. 4a, 4b, 4c and 4d depict an assembly process for mounting an SODIMM to the motherboard with the connector. As will be made more clear in the discussion immediately below, the connector is assembled as part of the process that connects/mounts the SODIMM to the motherboard.

As observed in FIG. 4a, the bottom part of the connector 402_2 is placed beneath the motherboard. Then, as observed in FIG. 4b, the top part of the connector 402_1 is placed above the motherboard 403. Here, referring briefly ahead to FIG. 5, the top and bottom parts of the connector have a pair of aligned, hollow stand-offs 507, 508 at both edges of the connector (for ease of drawing FIG. 5 only shows one of the edges). For each pair of stand offs 507, 508 at a same edge, one of the stand offs 507 (the "inner" stand-off) is inserted through a through hole in the motherboard 503 and the other stand off 508 (the "outer" stand-off) resides in free space off the edge of the motherboard 503.

The hole in the motherboard 503 through which the inner stand off 507 is placed is close to the edge of the motherboard 503, which, in turn, forces an "outer" portion of the top and bottom parts closest to the SODIMM to reside off the edge of the motherboard 503. Besides a pair of inner and outer stand-offs at both edges of the card, there are also inner and outer stand offs in the middle of the connectors half way between the edges. Thus, there is a row of three inner stand-offs and a row of three outer stand-offs.

As observed in FIG. 4*b*, screws 406 are inserted into the inner stand-offs from the top side and tightened (the bottom side of the stand offs are threaded so the screws 406 can anchor to the far end of the stand-off thereby securing the top and bottom parts together). Screws are not inserted into the outer stand-offs.

As observed in FIG. 4*c*, the SODIMM is inserted into the edge of the connector that resides off the edge of the motherboard. As observed in FIG. 4*d*, screws 409 are inserted into the outer stand offs and tightened thereby rigidly clamping the SODIMM between the outer portions of the top and bottom parts.

It is pertinent to point out that the specific dimensions used in the particular embodiment described just above are only exemplary and other embodiments can exist having different dimensions. Additionally, the specific embodiment described above has been developed for an SODIMM that complies with Joint Electron Device Engineering Council (JEDEC) DDR5 SODIMM standards. It is pertinent to point out that the teachings herein can be applied to SODIMMs that comply with other standards. Further still, the teachings herein can be applied to modules that plug-into a board other than memory modules (e.g., processor plug-ins, graphical processor plug-ins, accelerator plug-ins, storage plug-ins, etc.).

The following discussion concerning FIGS. 6, 7 and 8 are directed to systems, data centers and rack implementations, generally. It is pertinent to point out that any system, data center or rack described below can have a module that connects to an electronic circuit board with a connector designed according to the teachings provided above.

FIG. 6 depicts an example system. System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein. In some cases, accelerators 642 can be integrated into a CPU socket (e.g., a connector to a motherboard or circuit board that includes a CPU and provides an electrical interface with the CPU). For example, accelerators 642 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 642 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, volatile memory, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 600 includes interface 614, which can be coupled to interface 612. In one example, interface 614 represents an interface circuit, which can include stand-alone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data in a persistent state (e.g., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (e.g., the value or state of the data is indeterminate if power is interrupted to system 600). In one example, storage subsystem 680 includes controller 682 to interface with storage 684. In one example controller 682 is a physical part of interface 614 or processor 610 or can include circuits or logic in both processor 610 and interface 614.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall)

and SOT (Spin Orbit Transfer) based device, a thyristor based memory device, or a combination of any of the above, or other memory.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

FIG. 7 depicts an example of a data center. Various embodiments can be used in or with the data center of FIG. 7. As shown in FIG. 7, data center 700 may include an optical fabric 712. Optical fabric 712 may generally include a combination of optical signaling media (such as optical cabling) and optical switching infrastructure via which any particular sled in data center 700 can send signals to (and receive signals from) the other sleds in data center 700. However, optical, wireless, and/or electrical signals can be transmitted using fabric 712. The signaling connectivity that optical fabric 712 provides to any given sled may include connectivity both to other sleds in a same rack and sleds in other racks.

Data center 700 includes four racks 702A to 702D and racks 702A to 702D house respective pairs of sleds 704A-1 and 704A-2, 704B-1 and 704B-2, 704C-1 and 704C-2, and 704D-1 and 704D-2. Thus, in this example, data center 700 includes a total of eight sleds. Optical fabric 712 can provide sled signaling connectivity with one or more of the seven other sleds. For example, via optical fabric 712, sled 704A-1 in rack 702A may possess signaling connectivity with sled 704A-2 in rack 702A, as well as the six other sleds 704B-1, 704B-2, 704C-1, 704C-2, 704D-1, and 704D-2 that are distributed among the other racks 702B, 702C, and 702D of data center 700. The embodiments are not limited to this example. For example, fabric 712 can provide optical and/or electrical signaling.

FIG. 8 depicts an environment 800 that includes multiple computing racks 802, each including a Top of Rack (ToR) switch 804, a pod manager 806, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 808, and INTEL® ATOM™ pooled compute drawer 810, a pooled storage drawer 812, a pooled memory drawer 814, and a pooled I/O drawer 816. Each of the pooled system drawers is connected to ToR switch 804 via a high-speed link 818, such as a 40 Gigabit/second (Gb/s) or 100 Gb/s Ethernet link or an 100+Gb/s Silicon Photonics (SiPh) optical link. In one embodiment high-speed link 818 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 800 may be interconnected via their ToR switches 804 (e.g., to a pod-level switch or data center switch), as illustrated by connections to a network 820. In some embodiments, groups of computing racks 802 are managed as separate pods via pod manager(s) 806. In one embodiment, a single pod manager is used to manage all of the racks in the pod. Alternatively, distributed pod managers may be used for pod management operations. RSD environment 800 further includes a management interface 822 that is used to manage various aspects of the RSD environment. This includes managing rack configuration, with corresponding parameters stored as rack configuration data 824.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
    a connector to connect an electronic module to an edge of a first electronic circuit board, the module comprising a second electronic circuit board, the connector comprising:
    a top part that houses a first row of I/Os, the top part to be placed on a surface of the first electronic circuit board;
    a bottom part that houses a second row of I/Os, the bottom part to be placed on an opposite surface of the first electronic circuit board, wherein, the top and bottom parts form inner and outer stand-offs when mated together, the inner stand-off to reside within a through hole of the first electronic circuit board, the outer stand-off to reside within free space off the edge of the first electronic circuit board, the second electronic circuit board to be pressed in between the first row of I/Os and the second row of I/Os when the module is connected to the connector.

2. The apparatus of claim 1 wherein the module is a memory module.

3. The apparatus of claim 2 wherein the memory module is a small outline dual in line memory module (SODIMM).

4. The apparatus of claim 3 wherein the SODIMM is compliant with a JEDEC specification.

5. The apparatus of claim 1 wherein the first and second rows of I/Os are pins that exert a spring force upon corresponding traces on the second electronic circuit board when the module is connected to the connector.

6. The apparatus of claim 1 wherein the inner stand-off is threaded in a hollow region.

7. The apparatus of claim 6 wherein the outer stand-off is threaded in a hollow region.

8. An apparatus, comprising:
a motherboard having a central processing unit;
a memory module connected to an edge of the motherboard through a connector that is mounted to the edge of the motherboard, the connector comprising i) and ii) below:
i) a top part that houses a first row of I/Os, the top part placed on a surface of the motherboard;
ii) a bottom part that houses a second row of I/Os, the bottom part placed on an opposite surface of the motherboard, wherein, the top and bottom parts form inner and outer stand-offs, the inner stand-off within a through hole of the mother board, the outer stand-off within free space off the edge of the motherboard, an electronic circuit board of the memory module being pressed in between the first row of I/Os and the second row of I/Os.

9. The apparatus of claim 8 wherein the apparatus is a notebook computer.

10. The apparatus of claim 8 wherein the memory module is a small outline dual in line memory module (SODIMM).

11. The apparatus of claim 10 wherein the SODIMM is compliant with a JEDEC specification.

12. The apparatus of claim 8 wherein the first and second rows of I/Os are pins that exert a spring force upon corresponding traces on the electronic circuit board of the memory module.

13. The apparatus of claim 8 wherein the inner stand-off has a screw threaded therein.

14. The apparatus of claim 13 wherein the outer stand-off has another screw threaded therein.

15. A method, comprising:
mating a top part and a bottom part of a connector to one another, the top part comprising a first row of I/Os, the bottom part comprising a second row of I/Os, the top part placed on a side of an electronic circuit board, the bottom part placed on an opposite side of the electronic circuit board, the top part and the bottom part forming an inner stand-off and an outer stand-off when mated, the inner stand-off within a through hole of the electronic circuit board, the outer stand-off residing off an edge of the electronic circuit board;
attaching the top part to the bottom part by threading a first screw into the inner stand-off;
inserting a module's electronic circuit board between the first row of I/Os and the second row of I/Os; and,
securing the top part, the bottom part and the module by threading a second screw into the outer stand-off.

16. The method of claim 15 wherein the electronic circuit board is a motherboard of a computing system.

17. The method of claim 16 wherein the computing system is a notebook computer.

18. The method of claim 15 wherein the module is a memory module.

19. The method of claim 18 wherein the memory module is an SODIMM.

20. The method of claim 19 wherein the SODIMM is compliant with a JEDEC specification.

* * * * *